United States Patent
Isik (10) Patent No.: US 7,816,959 B1
(45) Date of Patent: Oct. 19, 2010

(54) CLOCK CIRCUIT FOR REDUCING LONG TERM JITTER

(75) Inventor: Tacettin Isik, Saratoga, CA (US)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 12/391,105

(22) Filed: Feb. 23, 2009

(51) Int. Cl.
H03L 7/06 (2006.01)
(52) U.S. Cl. .................... 327/156; 327/147
(58) Field of Classification Search ............ 327/147, 327/149, 156, 158
See application file for complete search history.

(56) References Cited

U.S. PATENT DOCUMENTS

| | | | | |
|---|---|---|---|---|
| 4,712,078 | A * | 12/1987 | Slobodnik et al. | 331/99 |
| 5,796,358 | A * | 8/1998 | Shih et al. | 341/139 |
| 5,808,573 | A * | 9/1998 | Shih et al. | 341/110 |
| 6,161,003 | A * | 12/2000 | Lo Curto et al. | 455/260 |
| 6,310,653 | B1 * | 10/2001 | Malcolm et al. | 348/537 |
| 6,342,798 | B1 * | 1/2002 | Yoshida | 327/156 |
| 6,583,654 | B2 * | 6/2003 | Kim et al. | 327/160 |
| 6,658,748 | B1 * | 12/2003 | Leipold et al. | 331/179 |
| 6,744,324 | B1 * | 6/2004 | Adams et al. | 331/17 |
| 6,961,013 | B2 * | 11/2005 | Lin et al. | 341/155 |
| 6,987,409 | B2 * | 1/2006 | Kim et al. | 327/158 |
| 7,019,677 | B1 * | 3/2006 | Soman et al. | 341/144 |
| 7,088,275 | B2 * | 8/2006 | Waltari | 341/155 |
| 7,352,297 | B1 * | 4/2008 | Rylyakov et al. | 341/50 |
| 7,403,073 | B2 * | 7/2008 | Kossel et al. | 331/16 |
| 7,483,508 | B2 * | 1/2009 | Staszewski et al. | 375/376 |
| 7,492,850 | B2 * | 2/2009 | Menolfi et al. | 375/376 |
| 7,639,086 | B2 * | 12/2009 | Lee et al. | 331/1 A |
| 7,679,459 | B2 * | 3/2010 | Menolfi et al. | 331/57 |
| 7,724,862 | B2 * | 5/2010 | Menolfi et al. | 375/376 |
| 2002/0009170 | A1 * | 1/2002 | Schmatz | 375/371 |
| 2004/0160250 | A1 * | 8/2004 | Kim et al. | 327/158 |
| 2004/0218705 | A1 * | 11/2004 | Cranford et al. | 375/355 |
| 2007/0047689 | A1 * | 3/2007 | Menolfi et al. | 375/376 |
| 2007/0146024 | A1 * | 6/2007 | Allan | 327/156 |
| 2008/0292040 | A1 * | 11/2008 | Menolfi et al. | 375/376 |
| 2009/0002082 | A1 * | 1/2009 | Menolfi et al. | 331/57 |
| 2009/0128201 | A1 * | 5/2009 | Chen et al. | 327/149 |
| 2009/0129524 | A1 * | 5/2009 | Chen et al. | 375/376 |
| 2009/0174492 | A1 * | 7/2009 | Zhang | 331/1 R |

* cited by examiner

Primary Examiner—Lincoln Donovan
Assistant Examiner—Adam D Houston
(74) Attorney, Agent, or Firm—Stanley J. Pawlik; Kenneth Glass; Glass & Associates (57) ABSTRACT

A clock circuit generates a reference clock signal based on a resonant frequency of a crystal, generates thermometer-coded signals based on the reference clock signal, and generates a pulse train based on the thermometer-coded signals. The pulse train has a frequency that is a multiple of the frequency of the reference clock signal. Additionally, the clock circuit includes a phase-lock loop for generating an output clock signal based on the pulse train and aligning a phase of the output clock signal with pulses in the pulse train. In various embodiments, the frequency of the reference clock signal is the same as the resonant frequency of the crystal and the frequency of the output clock signal is a multiple of the resonant frequency of the crystal. Moreover, reference clock signal and the output clock signal each have a long-term jitter based on the precision of the resonant frequency of the crystal.

20 Claims, 7 Drawing Sheets

CLOCK CIRCUIT FOR REDUCING LONG TERM JITTER

BACKGROUND

A clock circuit often includes a crystal oscillator for generating a clock signal. The crystal oscillator includes a crystal manufactured from a piezoelectric material to have a precise resonant frequency. Moreover, the frequency of the clock signal is the same as the resonant frequency of the crystal. As a result, the frequency of the clock signal has the same precision as the precision of the resonant frequency of the crystal.

Generally, the precision of a resonant frequency of a crystal increases as the resonant frequency of the crystal decreases. As a result, the precision of the frequency of a clock signal generated by the crystal oscillator including the crystal decreases as the resonant frequency of the crystal increases. Additionally, the size and cost of a crystal having a higher resonant frequency are higher than the size and cost of a crystal having a lower resonant frequency. As a result, the size and cost of a clock circuit containing the crystal having the higher resonant frequency tends to be higher than the size and cost of a clock circuit containing the crystal having the lower resonant frequency. Moreover, some applications require two clock signals each having a precise frequency. In these applications, the clock circuit generates one of the clock signals based on a crystal having a lower resonant frequency and the other clock signal based on a crystal having a higher resonant frequency.

In light of the above, a need exists for an improved system and method of generating a clock signal based on a crystal. A further need exists for reducing the size and cost of a clock circuit that generates two clock signals each having a precise frequency.

SUMMARY

In various embodiments, a clock circuit includes a reference clock signal generator for generating a reference clock signal having a peak amplitude based on a reference voltage and a frequency based on a resonant frequency of a crystal. The clock circuit also includes an analog-to-digital converter for converting the reference clock signal into thermometer-coded signals based on the reference clock signal and the reference voltage. Further, the clock circuit includes a thermometer decoder for generating a pulse train based on the thermometer-coded signals. Moreover, the pulse train has a frequency that is a multiple of the frequency of the reference clock signal. Additionally, the clock circuit includes a phase-lock loop for generating an output clock signal based on the pulse train and aligning a phase of the output clock signal with pulses in the pulse train. In this way, the clock circuit generates the reference clock signal and the output clock signal based on the resonant frequency of the crystal. Moreover, the reference clock signal and the output clock signal each have a long-term jitter based on the precision of the resonant frequency of the crystal.

The clock circuit is useful in applications requiring two clock signals having precise frequencies, namely the reference clock signal and the output clock signal. For example, an application may require a clock signal having a precise lower frequency for operating a real-time-clock and a clock signal having a precise higher frequency for performing high-speed serial communications. Because the frequency of the output clock signal has the same precision as the precision of the resonant frequency of the crystal, long-term jitter is reduced in the output clock signal in comparison to a conventional clock circuit using a crystal having a higher frequency and a lower precision. Further, the size and cost of the crystal are reduced in comparison to the conventional clock circuit. Additionally, power consumption in the clock circuit is reduced in comparison to the conventional clock circuit.

A system, in accordance with one embodiment, includes a reference clock signal generator, an analog-to-digital converter, a thermometer decoder, and a phase-lock loop. The analog-to-digital converter is coupled to the reference clock signal generator and the thermometer decoder. Additionally, the thermometer decoder is coupled to the phase-lock loop. The reference clock signal generator is configured to generate a reference voltage and a reference clock signal having a peak amplitude based on the reference voltage. The analog-to-digital converter is configured to generate thermometer-coded signals based on the reference clock signal and the reference voltage. The thermometer decoder is configured to generate a pulse train based on the thermometer-coded signals. The phase-lock loop is configured to generate an output clock signal based on the pulse train and align a phase of the output clock signal with pulses of the pulse train.

A system, in accordance with one embodiment, includes a reference clock signal generator, an analog-to-digital converter, a thermometer decoder, and a phase lock loop. The analog-to-digital converter is coupled to the reference clock signal generator and the thermometer decoder. Additionally, the thermometer decoder is coupled to the phase-lock loop. The reference clock signal generator is configured to generate a reference voltage and a reference clock signal having a peak amplitude based on the reference voltage. The analog-to-digital converter includes a voltage divider and a thermometer circuit coupled to the voltage divider. The voltage divider is configured to generate voltages by dividing the reference voltage based on a waveform of the reference clock signal. The thermometer circuit is configured to generate thermometer-coded signals based on the reference clock signal and the voltages. The thermometer decoder is configured to generate a pulse train based on the thermometer-coded signals. The phase-lock loop is configured to generate an output clock signal based on the pulse train and align a phase of the output clock signal with pulses of the pulse train.

A method, in accordance with one embodiment, includes generating a reference voltage and generating a reference clock signal having a peak amplitude based on the reference voltage. The method further includes generating thermometer-coded signals based on the reference clock signal and the reference voltage. Additionally, the method includes generating a pulse train based on the thermometer-coded signals and generating an output clock signal based on the pulse train. Further, the method includes aligning a phase of the output clock signal with pulses of the pulse train.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a clock circuit generates a reference clock signal having a precise frequency based on a crystal and converts the reference clock signal into a pulse train. The pulse train has a frequency that is a multiple of the frequency of the reference clock signal. Further, the clock circuit generates an output clock signal based on the pulse train and aligns a phase of the output clock signal with pulses in the pulse train. In this way, the clock circuit generates the output clock signal having a precise frequency that is a multiple of the frequency of the reference clock signal. Moreover, the clock circuit generates a pair of signals having precise frequencies, namely the reference clock signal and the output clock signal, based on the crystal.

Figure 1:
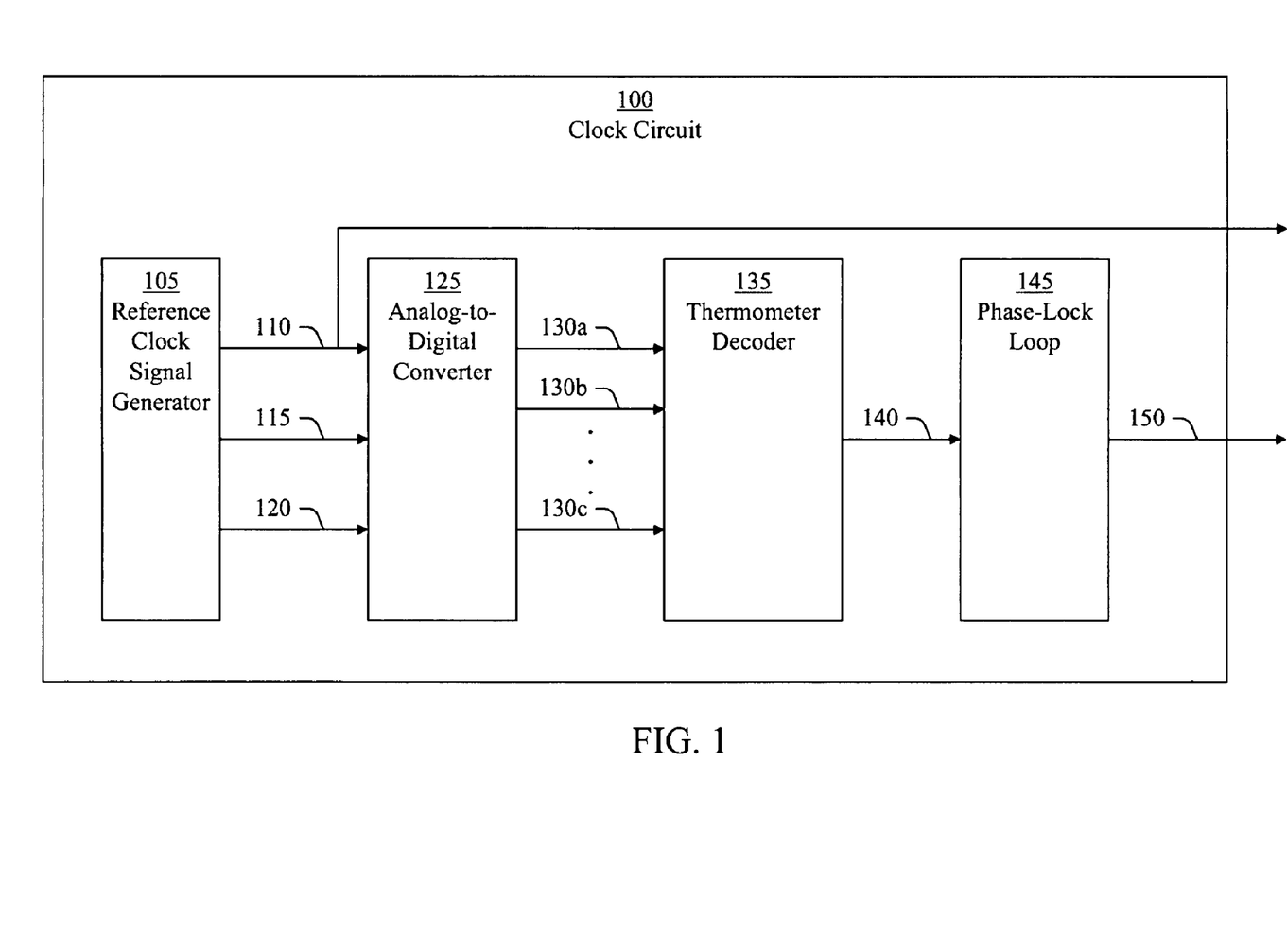
FIG. 1 is a block diagram of a clock circuit, in accordance with an embodiment of the present invention.

FIG. 1 illustrates a clock circuit 100, in accordance with an embodiment of the present invention. The clock circuit 100 includes a reference clock signal generator 105, an analog-to-digital converter 125, a thermometer decoder 135, and a phase-lock loop 145. The analog-to-digital converter 125 is coupled (e.g., connected) to the reference clock signal generator 105 and the thermometer decoder 135. Further, the thermometer decoder 135 is coupled (e.g., connected) to the phase-lock loop 145. The clock circuit 100 generates a reference clock signal 110 and a reference voltage 115. The reference clock signal 110 has a periodic waveform having a peak amplitude based on the reference voltage 115 and has a reference frequency. The analog-to-digital converter 125 generates thermometer-coded signals 130 (e.g., thermometer-coded signals 130a-c) based on the reference clock signal 110 and the reference voltage 115. The thermometer decoder 135 generates a pulse train 140 based on the thermometer-coded signals 130. The phase-lock loop 145 generates an output clock signal 150 based on the pulse train 140. Moreover, the pulse train has a frequency that is a positive integer multiple of the reference frequency of the reference clock signal 110 and the output clock signal 150 has a frequency that is a multiple of the reference frequency of the reference clock signal 110.

In some embodiments, the reference clock signal generator 105 also generates an optional quadrature clock signal 120 having a phase that is offset from a phase of the reference clock signal 110 by ninety degrees. Further, the analog-to-digital converter 125 generates the thermometer-coded signals 130 based on the quadrature clock signal 120 in addition to the reference clock signal 110 and the reference voltage 115, as is described more fully herein. Although three thermometer-coded signals 130a-c are illustrated in FIG. 1, the analog-to-digital converter 125 may generate more or fewer than three thermometer-coded signals 130 in other embodiments.

In various embodiments, the frequency of the output clock signal 150 has a precision based on a precision of the reference clock signal 110. Additionally, the output clock signal 150 has a long-term jitter based on the precision of the frequency of the output clock signal 150. In this way, the long-term jitter of the output clock signal 150 is based on the precision of the reference frequency of the reference clock signal 110. For example, the long-term jitter of the output clock signal 150 may be determined by counting a number of cycles of the output clock signal 150 (e.g., a thousand clock cycles) and determining how much the output clock signal 150 has drifted away from the reference clock signal 110 on the last cycle counted.

In one embodiment, the reference clock signal 110 has a sinusoidal waveform. In another embodiment, the reference clock signal 110 has a triangular waveform. In other embodiments, the reference clock signal 110 may have a periodic waveform other than a sinusoidal waveform or a triangular waveform.

Figure 2:
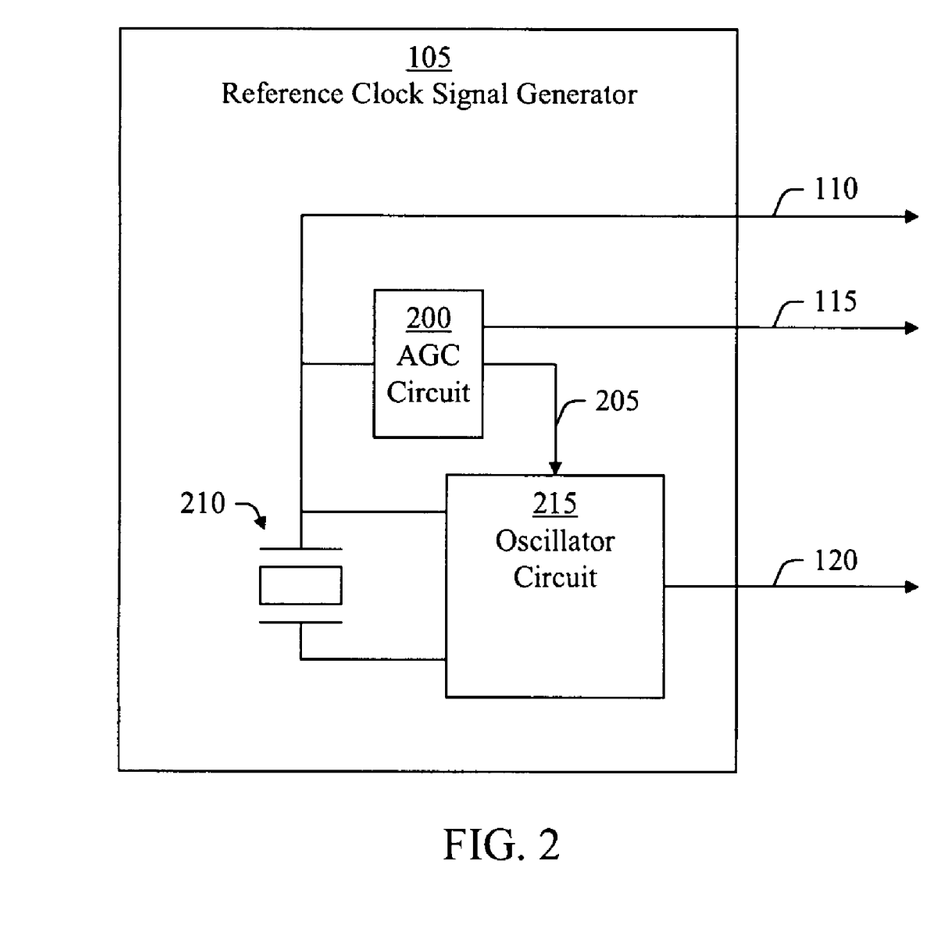
FIG. 2 is a block diagram of a reference clock signal generator, in accordance with an embodiment of the present invention.

FIG. 2 illustrates the reference clock signal generator 105, in accordance with an embodiment of the present invention. The reference clock signal generator 105 includes an automatic gain control circuit (AGC circuit) 200, a crystal 210, and an oscillator circuit 215. One end of the crystal 210 is coupled (e.g., connected) to the automatic gain control circuit 200 and the oscillator circuit 215, and another end of the crystal 210 is coupled (e.g., connected) to the oscillator circuit 215. Additionally, the automatic gain control circuit 200 is coupled (e.g., connected) to the oscillator circuit 215. The crystal 210 and the oscillator circuit 215 together form a crystal oscillator. In some embodiments, the crystal 210 is external to the reference clock signal generator 105. For example, the reference clock signal generator 105 may be implemented in an integrated circuit which is connected to the crystal 210.

The automatic gain control circuit 200 generates the reference voltage 115. For example, the automatic gain control circuit 200 may include a voltage regulator for maintaining the reference voltage 115 substantially constant. Additionally, the automatic gain control circuit 200 generates a gain control signal 205 based on the reference voltage 115 and the reference clock signal 110. The gain control signal 205 indicates a gain for the oscillator circuit 215. Moreover, the oscillator circuit 215 generates the reference clock signal 110 having a substantially constant peak amplitude based on the gain control signal 205. For example, the oscillator circuit 215 may generate the reference clock signal 110 having a peak amplitude substantially equal to the reference voltage 115 (e.g., +/−1% of the reference voltage 115) based on the gain control signal 205. In some embodiments, the oscillator circuit 215 generates the quadrature clock signal 120 having the same frequency of the reference clock signal 110 and a peak amplitude substantially equal to the peak amplitude of the reference clock signal 110.

In various embodiments, the crystal 210 is composed of a piezoelectric material, such as quartz, and has a resonant frequency and a frequency tolerance. Moreover, the clock circuit 100 generates both the reference clock signal 110 and the output clock signal 150 based on the resonant frequency and frequency tolerance of the crystal 210. In this way, the clock circuit 100 generates both the clock signal 110 and the output clock signal 150 based on a single crystal 210, which reduces size and cost of the clock circuit 100 in comparison to conventional clock circuits requiring more than one crystal. Further, the frequency of the pulse train 140 is a multiple of the resonant frequency of the crystal 210 and has a frequency tolerance based on the frequency tolerance of the crystal 210. As a result, the sampling rate of the phase-lock loop 145 is increased over a conventional clock circuit without reducing precision of the frequency of the output clock signal 150, which reduces long term jitter in the output clock signal 150.

In various embodiments, the clock circuit 100 or portions thereof are implemented in a semiconductor die. For example, portions of the clock circuit 100 excluding the crystal 210 may be implemented in a single semiconductor die. In some embodiments, the clock circuit 100 or portions thereof may be implemented in more than one semiconductor die contained in a multichip package.

Figure 3:
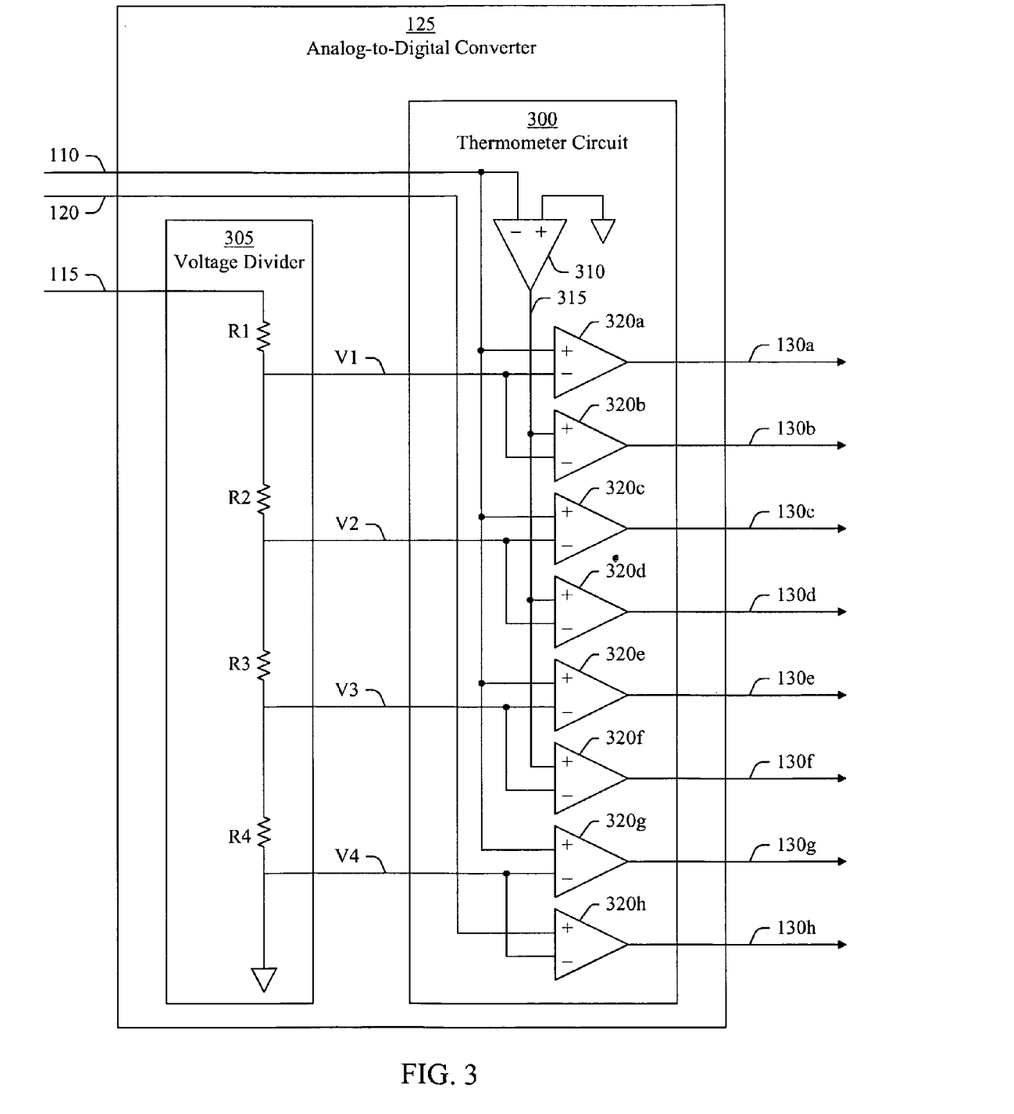
FIG. 3 is a block diagram of an analog-to-digital converter, in accordance with an embodiment of the present invention.

FIG. 3 illustrates the analog-to-digital converter 125, in accordance with an embodiment of the present invention. The analog-to-digital converter 125 includes a voltage divider 305 and a thermometer circuit 300 coupled (e.g., connected) to the voltage divider 305. The voltage divider 305 generates voltages V1, V2, V3, and V4 by dividing the reference voltage 115 based on the waveform of the reference clock signal 110, as is described more fully herein. The thermometer circuit 300 generates the thermometer-coded signals 130 (e.g., the thermometer-coded signals 130a-h) based on the reference clock signal 110, the quadrature signal 120, and the voltages V1, V2, V3, and V4. Although four voltages V1-V4 are illustrated in FIG. 3, the voltage divider 305 may generate more or fewer than four voltages in other embodiments. Although eight thermometer-coded signals 130a-h are illustrated in FIG. 3, the thermometer circuit 300 may generate more or fewer than eight thermometer-coded signals 130 in other embodiments.

The voltage divider 305 includes resistors R1, R2, R3, and R4 connected in a series circuit. One end of the resistor R4 is connected to a ground potential and the other end of the resistor R4 is connected to one end of the resistor R3. The other end of the resistor R3 is connected to one end of the resistor R2 and the other end of the resistor R2 is connected to one end of the resistor R1. The other end of the resistor R1 is connected to the reference voltage 115 generated by the reference clock signal generator 105. The voltage divider 305 generates the voltage V1 at a junction in which the resistor R1 is connected to the resistor R2 and generates the voltage V2 at a junction in which the resistor R2 is connected to the resistor R3. Additionally, the voltage divider 305 generates the voltage V3 at a junction in which the resistor R3 is connected to the resistor R4 and generates the voltage V4 at a junction in which the resistor R4 is connected to the ground potential. In various embodiments, the resistors R1-R4 are precision resistors (e.g., resistors having a tolerance of 1% or less).

The thermometer circuit 300 includes an inverting amplifier 310 for generating an inverted reference clock signal 315 based on the reference clock signal 110 by inverting the waveform of the reference clock signal 110. For example, the inverting amplifier 310 may be an inverting operational amplifier having a unity gain. The inverting amplifier 310 inverts the waveform of the reference clock signal 110 by inverting the amplitude (e.g., voltage) of the reference clock signal 110. Additionally, the thermometer circuit 300 includes comparators 320 (e.g., comparators 320a-h) corresponding to the thermometer-coded signals 130. Each of the comparators 320 receives the reference clock signal 110, the inverted reference clock signal 315, or the quadrature clock signal 120 as an input clock signal and one of the voltages V1-V4 as an input voltage. Further, each of the comparators 320 compares the input clock signal of the comparator 320 with the input voltage of the comparator 320 and generates the thermometer-coded signal 130 corresponding to the comparator 320 indicating whether the input clock signal is above or below the input voltage.

In the embodiment of FIG. 3, the comparator 320a generates the thermometer-coded signal 130a indicating whether the reference clock signal 110 is above or below the voltage V1. The comparator 320b generates the thermometer-coded signal 130b indicating whether the inverted reference clock signal 315 is above or below the voltage V1. The comparator 320c generates the thermometer-coded signal 130c indicating whether the reference clock signal 110 is above or below the voltage V2. The comparator 320d generates the thermometer-coded signal 130d indicating whether the inverted reference clock signal 315 is above or below the voltage V2. The comparator 320e generates the thermometer-coded signal 130e indicating whether the reference clock signal 110 is above or below the voltage V3. The comparator 320f generates the thermometer-coded signal 130f indicating whether the inverted reference clock signal 315 is above or below the voltage V3. The comparator 320g generates the thermometer-coded signal 130g indicating whether the reference clock signal 110 is above or below the voltage V4. The comparator 320h generates the thermometer-coded signal 130h indicating whether the quadrature clock signal 120 is above or below the voltage V4.

Each of the voltages V1-V3 defines two points on a waveform of the reference clock signal 110 in a period of the reference clock signal 110. For example, the reference clock signal 110 may have a sinusoidal waveform and each of the voltages V1-V3 may define two points on the sinusoidal waveform of the reference clock signal 110. Additionally, each of the voltages V1-V3 defines two points on a waveform of the inverted reference clock signal 315 in a period of the inverted reference clock signal 315. The voltage V4 defines two points on a waveform of the reference clock signal 110 at which the polarity of the reference clock signal 110 changes in a period of the reference clock signal 110. Further, the voltage V4 defines two points on a waveform of the quadrature clock signal 120 at which the polarity of the quadrature clock signal 120 changes in a period of quadrature clock signal 120.

In various embodiments, resistance values of the resistors R1-R4 are selected so that the voltages V1-V4 collectively divide a period of the reference clock signal 110 into a number of periods each having substantially the same duration. In this way, the voltage divider 305 generates the voltages V1-V4 by dividing the reference voltage 115 based on the waveform of the reference clock signal 110. Moreover, the thermometer-coded signals 130 collectively identify the voltages V1-V4 at transitions (e.g., edges) occurring in the thermometer-coded signals 130. For example, each of the thermometer-coded signals 130 may transition from a voltage indicating a logic value of zero to a voltage indicating a logic value of one when the input clock signal of the comparator 320 corresponding to the thermometer-coded signal 130 rises above the input voltage of the comparator 320. Further, each of the thermometer-coded signals 130 may transition from a voltage indicating a logic value of one to a voltage indicating a logic value of zero when the input clock signal of the comparator 320 corresponding to the thermometer-coded signal 130 falls below the input voltage of the comparator 320.

In various embodiments, the thermometer decoder 135 generates the pulse train 140 based on the thermometer-coded signals 130. The pulse train 140 includes a series of pulses in a period of the reference clock signal 110 each of which has a period having substantially the same duration. In this way, the period of the reference clock signal 110 is divided into a series of periods corresponding to the series of pulses in the pulse train 140. Moreover, each pulse in the pulse train 140 has two transitions (e.g., edges) corresponding to two transitions in one or more of the thermometer-coded signals 130. For example, a pulse in the pulse train 140 may have a transition corresponding to the transition of one thermometer-coded signal 130 and another transition corresponding to the transition of another thermometer-coded signal 130. As another example, a pulse in the pulse train 140 may have two transitions corresponding to two transitions in a thermometer-coded signal 130.

In various embodiments, the thermometer decoder 135 may include any circuit or device for generating the pulse train 140 by decoding the thermometer-coded signals 130. For example, the thermometer decoder 135 may be a combinational logic circuit, a sequential logic circuit, a read-only memory (ROM), a programmable read-only memory (PROM), a flash memory, a programmable logic device (PLD), a programmable logic array (PLA), or the like. Moreover, the pulse train 140 may be expressed as a logic function of the thermometer-coded signals 130.

Figure 4:
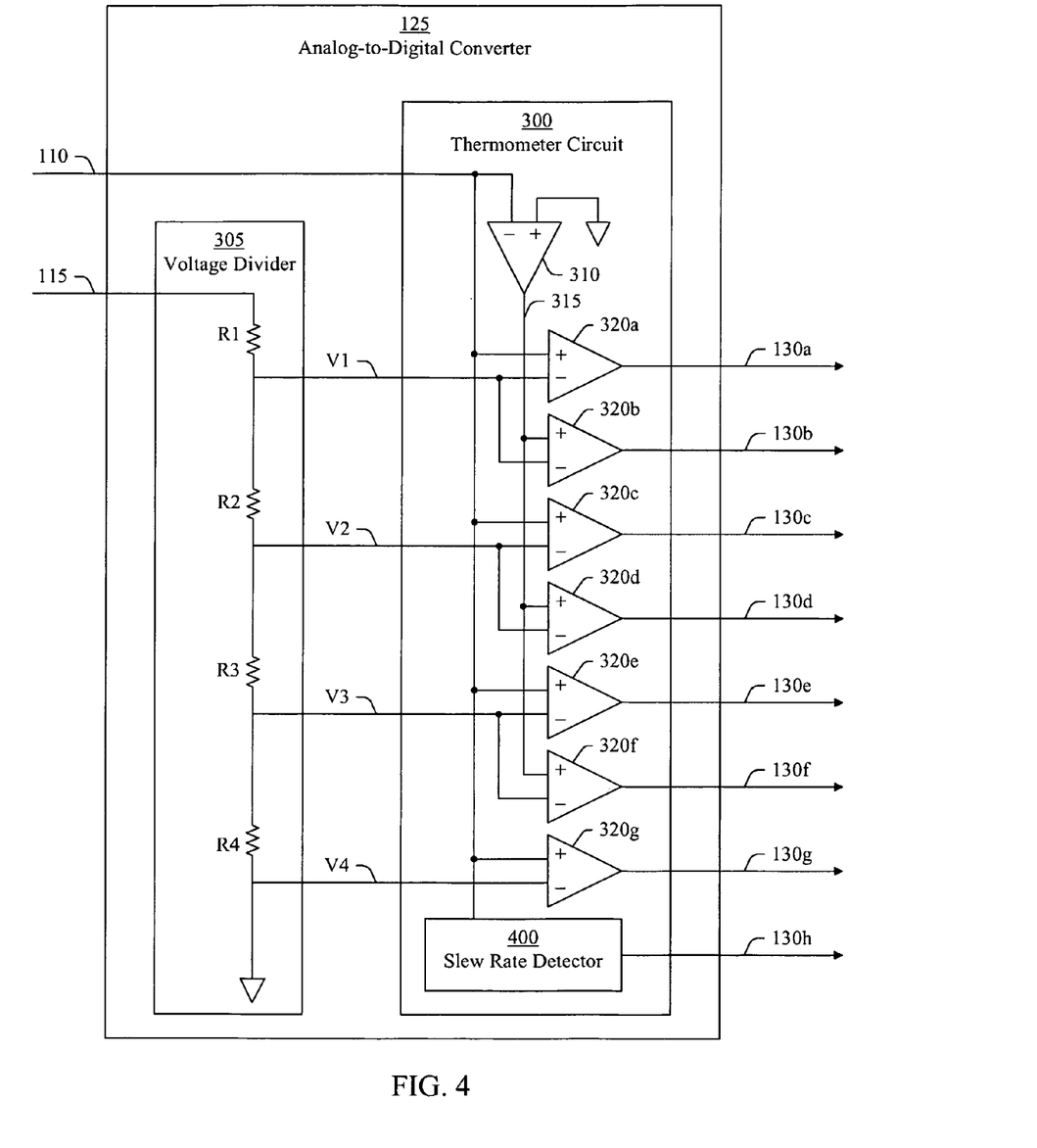
FIG. 4 is a block diagram an analog-to-digital converter, in accordance with an embodiment of the present invention.

FIG. 4 illustrates the analog-to-digital converter 125, in accordance with an embodiment of the present invention. The analog-to-digital converter 125 illustrated in FIG. 4 is similar to the analog-to-digital converter 125 of FIG. 3 and includes the voltage divider 305 and the thermometer circuit 300. In contrast to the analog-to-digital converter 125 of FIG. 3, the thermometer circuit 300 of the analog-to-digital converter 125 illustrated in FIG. 4 includes a slew-rate detector 400 instead of the comparator 320h.

The slew-rate detector 400 generates the thermometer-coded signal 130h based on the reference clock signal 110. Moreover, the thermometer-coded signal 130h indicates the slew of the reference clock signal 110, which occurs at the peak amplitude of the reference clock signal 110. Because the reference clock signal 110 has a peak amplitude at a positive voltage and a peak amplitude at a negative voltage, the thermometer-coded signal 130h defines two points on the waveform of the reference clock signal 110. In this embodiment, the reference clock signal generator 105 need not generate the quadrature clock signal 120 and the analog-to-digital converter 125 need not generate any of the thermometer-coded signals 130 based on the quadrature clock signal 120.

Figure 5:
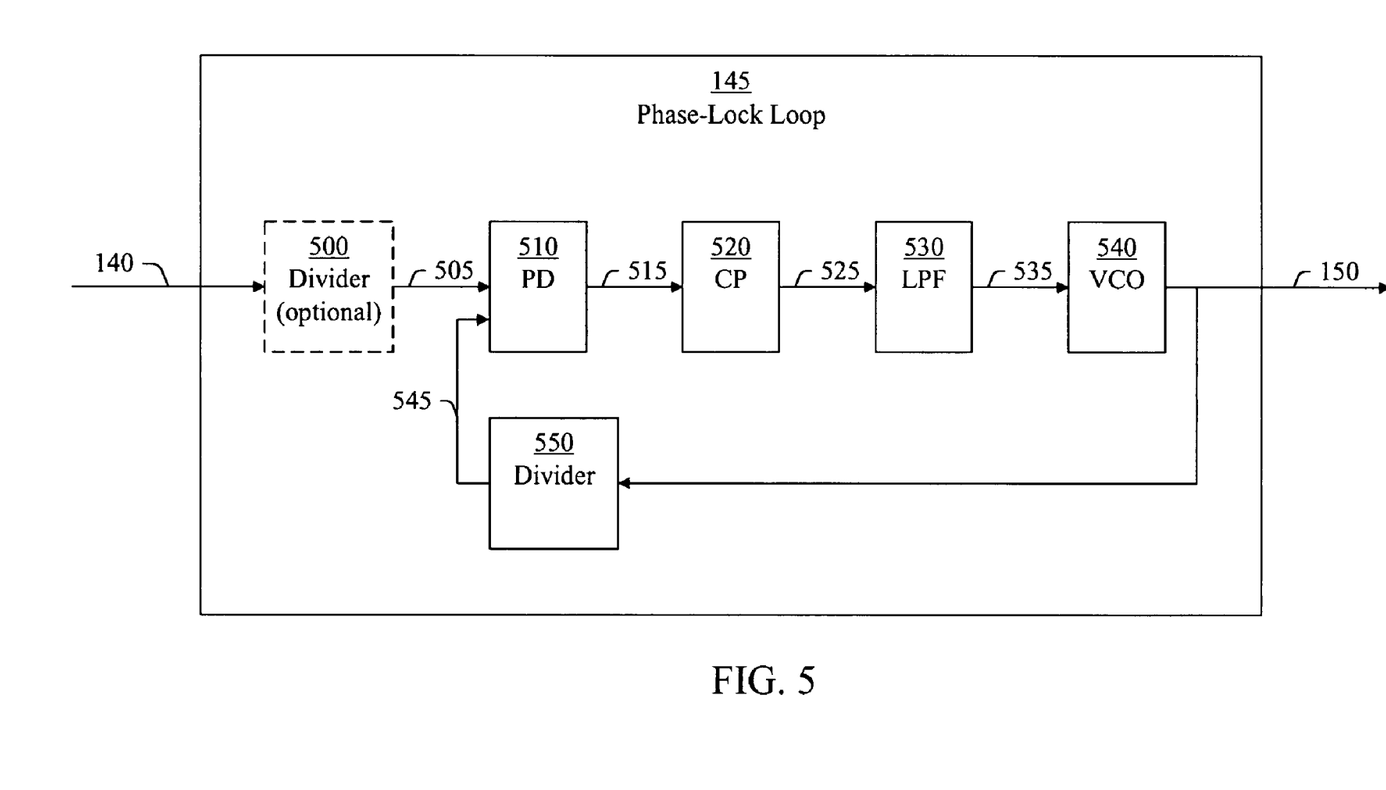
FIG. 5 is a block diagram of a phase-lock loop, in accordance with an embodiment of the present invention.

FIG. 5 illustrates the phase-lock loop 145, in accordance with an embodiment of the present invention. The phase-lock loop 145 includes an optional divider 500, a phase detector (PD) 510, a charge pump (CP) 520, a low-pass filter (LPF) 530, a voltage-controlled oscillator (VCO) 540, and a divider 550 (e.g., a feedback divider). The phase detector 510 is coupled (e.g., connected) to the divider 500, the charge pump 520, and the divider 550. The low-pass filter 530 is coupled (e.g., connected) to the charge pump 520 and the voltage-controlled oscillator 540. Additionally, the divider 550 is coupled (e.g., connected) to the voltage-controlled oscillator 540.

The divider 500 generates an input clock signal 505 based on the pulse train 140 by dividing a frequency of the pulse train 140 by a divisor. In embodiments without the divider 500, the input clock signal 505 is the pulse train 140. The divider 550 generates a feedback clock signal 545 based on the output clock signal 150 by dividing the frequency (e.g., a center frequency) of the output clock signal 150 by a divisor. The phase detector 510 generates a phase signal 515 based on the input clock signal 505 (e.g., the pulse train 140) and the feedback clock signal 545 indicating a phase difference between the input clock signal 505 and the feedback clock signal 545. The charge pump 520 generates a charge pump signal 525 based on the phase signal 515. The charge pump signal 525 includes a voltage indicating the phase difference between the input clock signal 505 and the feedback clock signal 545. The low-pass filter 530 generates a filtered signal 535 based on the charge pump signal 525 by filtering out higher frequency components of the charge pump signal 525. In turn, the voltage-controlled oscillator 540 generates the output clock signal 150 based on the filtered signal 535.

Figure 6:
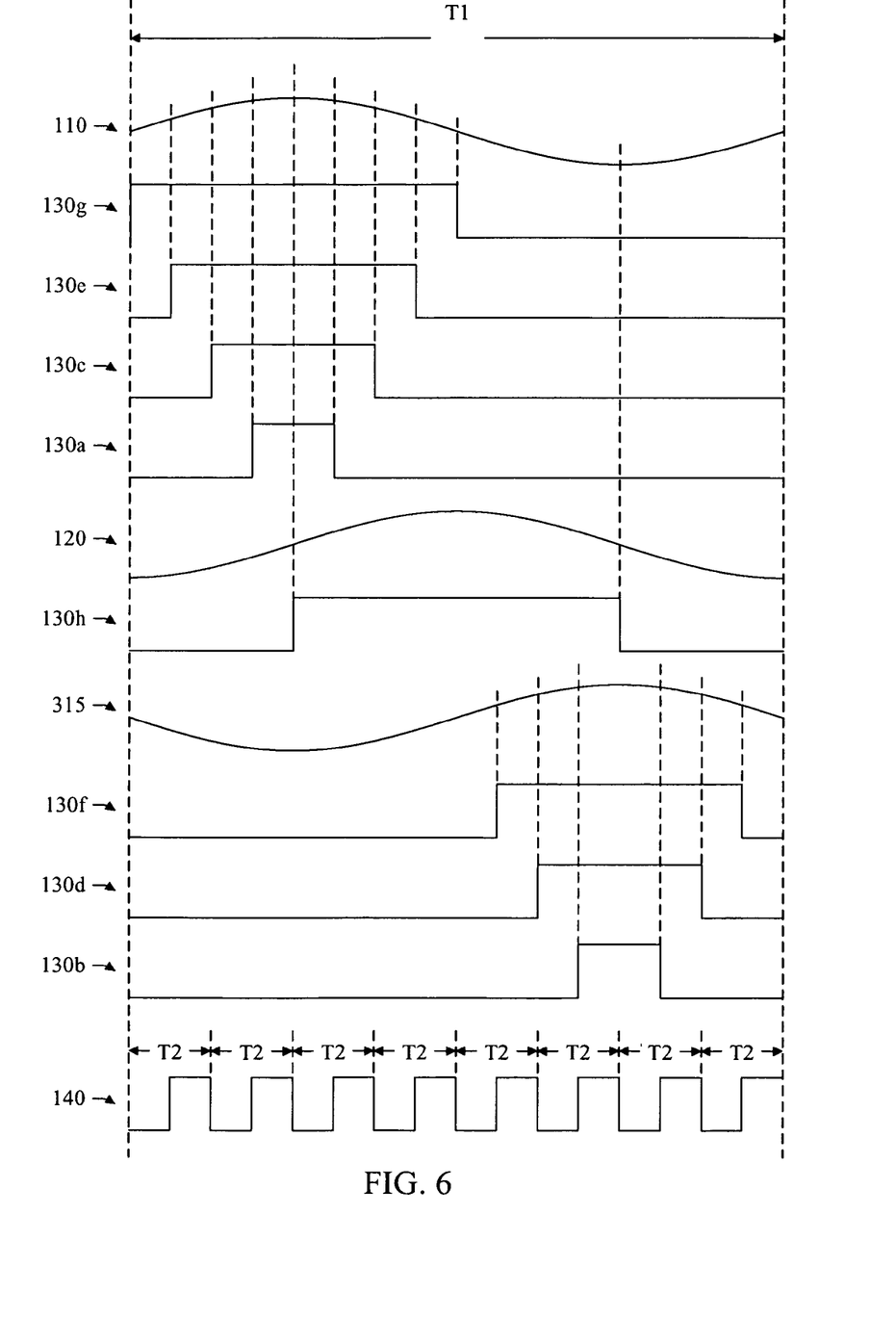
FIG. 6 is a timing diagram of signals in a clock circuit, in accordance with an embodiment of the present invention.

FIG. 6 illustrates signals in the clock circuit 100, in accordance with an embodiment of the present invention. The signals illustrated in FIG. 6 include the reference clock signal 110, the quadrature clock signal 120, the inverted reference clock signal 315, the thermometer-coded signals 130a-h, and the pulse train 140. Each of the reference clock signal 110, the quadrature clock signal 120, and the inverted reference clock signal 315 has a period T1. The thermometer-coded signals 130a-h collectively include sixteen transitions defining sixteen corresponding points in the period T1 of the reference clock signal 110 based on the voltages (e.g., voltages V1-V4) of the reference clock signal 110 at those points. As may be envisioned from FIG. 6, the pulse train 140 includes a series of eight pulses defined by the sixteen transitions of the thermometer-coded signals 130a-h. Moreover, each of the pulses in the pulse train 140 has a period T2 which is one-eighth of the period T1 of the reference clock signal 110. In this way, the period T1 of the reference clock signal 110 is divided into a series of eight periods T2 corresponding to the series of pulses in the pulse train 140.

As may be envisioned from FIG. 6, each pulse in the pulse train 140 has a voltage representing a logic value of zero in a first portion of the period T2 of the pulse train 140 containing the pulse and a voltage representing a logic value of one is a second portion of the period T2 containing the pulse. In some embodiments, the first portion of the period T2 containing a pulse of the pulse train 140 and the second portion of the period T2 containing the pulse have substantially the same duration. In these embodiments, the pulse train 140 has a square waveform. In other embodiments, the first portion of the period T2 containing a pulse of the pulse train 140 has a duration that is shorter or longer than the second portion of the period T2 containing the pulse. In these embodiments, the pulse train 140 has a rectangular waveform.

Figure 7:
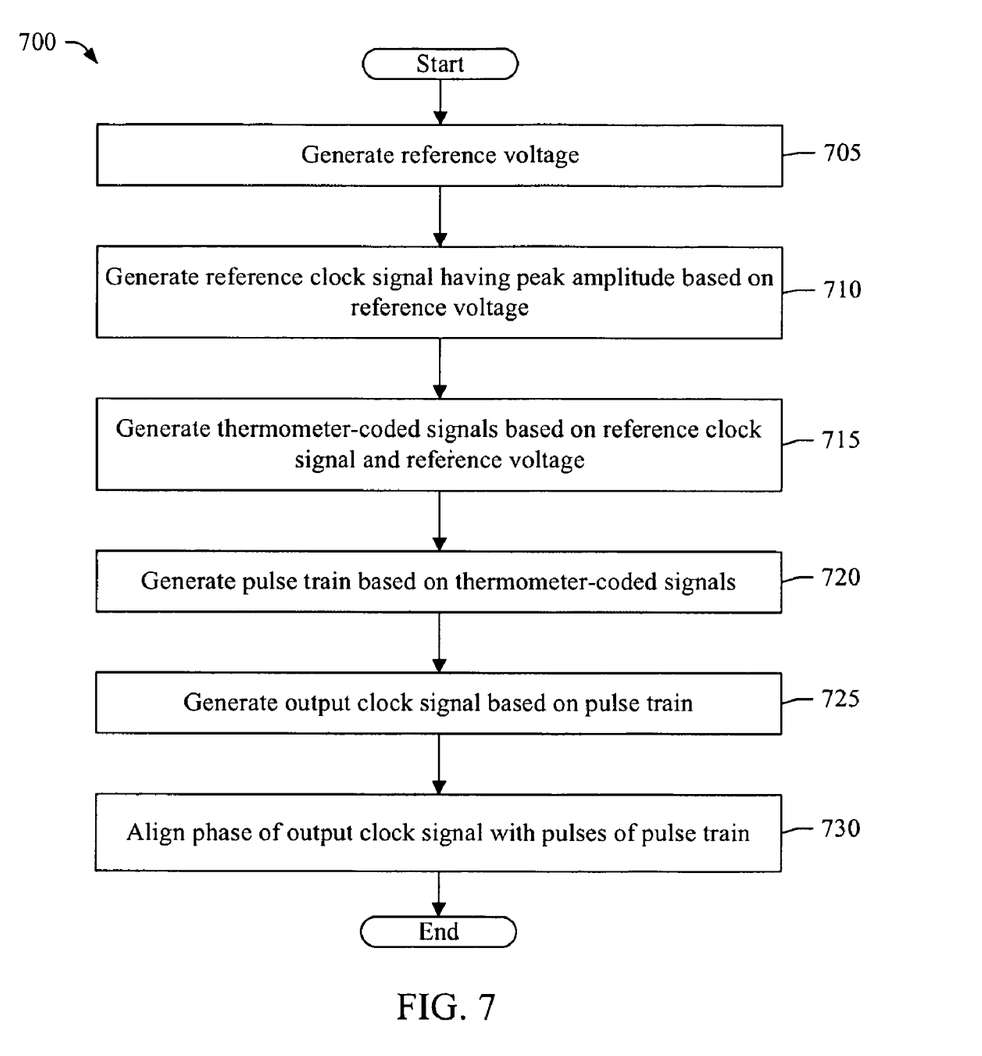
FIG. 7 is a flow chart of a method of generating a clock signal, in accordance with an embodiment of the present invention.

FIG. 7 is a flow chart of a method 700 of generating a clock signal, in accordance with an embodiment of the present invention. In step 705, a reference voltage is generated. In various embodiments, the reference clock signal generator 105 generates the reference voltage 115. For example, the automatic gain control circuit 200 of the reference clock signal generator 105 may generate the reference voltage 115. The method 700 then proceeds to step 710.

In step 710, a reference clock signal having a peak amplitude based on the reference voltage is generated. In various embodiments, the reference clock signal generator 105 generates the reference clock signal 110 having a peak amplitude based on the reference voltage 115. For example, the reference clock signal 110 may have a sinusoidal waveform in which the peak amplitude is the magnitude of both the highest voltage and the lowest voltage of the reference clock signal 110. Moreover, the reference clock signal generator 105 generates the reference clock signal 110 based on the resonant frequency of the crystal 210 and the precision of the resonant frequency of the crystal 210. The method 700 then proceeds to step 715.

In step 715, thermometer-coded signals are generated based on the reference clock signal and the reference voltage. In various embodiments, the analog-to-digital converter 125 generates the thermometer-coded signals 130 based on the reference clock signal 110 and the reference voltage 115. In further embodiments, the analog-to-digital converter 125 generates the thermometer-coded signals 130 based on the quadrature clock signal 120 in addition to the reference clock signal 110 and the reference voltage 115. The method 700 then proceeds to step 720.

In step 720, a pulse train is generated based on the thermometer-coded signals. In various embodiments, the thermometer decoder 135 generates the pulse train 140 based on the thermometer-coded signals 130. In some embodiments, the pulse train 140 has a square waveform. In other embodiments, the pulse train 140 has a rectangular waveform. The method 700 then proceeds to step 725.

In step 725, an output clock signal is generated based on the pulse train. In various embodiments, the phase-lock loop 145 generates the output clock signal 150 based on the pulse train 140. Moreover, the frequency of the output clock signal 150 is higher than the reference frequency of the reference clock signal 110. In some embodiments, the frequency of the output clock signal 150 is an integer multiple of the reference frequency of the reference clock signal 110. In embodiments in which the phase-lock loop 145 includes the divider 500, the frequency of the output clock signal 150 may be a fractional multiple of the reference frequency of the reference clock signal 110. The method 700 then proceeds to step 730.

In step 730, a phase of the output clock signal is aligned with pulses of the pulse train. In various embodiments, the phase-lock loop 145 aligns a phase of the output clock signal 150 with pulses in the pulse train 140. For example, the phase-lock loop 145 may align the phase of the output clock signal 150 with rising transitions in the pulses of the pulse train 140. In this way, the phase-lock loop 145 generates the output clock signal 150 based on the reference frequency of the reference clock signal 110.

Because the reference frequency of the reference clock signal 110 is based on the resonant frequency of the crystal 210, the phase-lock loop 145 also generates the output clock signal 150 based on the resonant frequency of the crystal 210. Thus, the clock circuit 100 generates both the reference clock signal 110 and the output clock signal 150 based on the resonant frequency of the crystal 210. Moreover, both the long-term jitter of the reference clock signal 110 and the long-term jitter of the output clock signal 150 are based on the precision of the resonant frequency of the crystal 210. The method 700 then ends.

In various embodiments, the method 700 may include more or fewer steps than the steps 705-730 described above and illustrated in FIG. 7. In some embodiments, one or more of the steps 705-730 of the method 700 may be performed in parallel or substantially simultaneously. For example the step 705 and the step 710 may be performed in parallel. In various embodiments, the steps 705-730 of the method 700 may be performed in a different order than the order described above and illustrated in FIG. 7. For example, step 710 may be performed before step 705.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system comprising:
 a reference clock signal generator configured to generate a reference voltage and a reference clock signal having a peak amplitude based on the reference voltage;
 an analog-to-digital converter coupled to the reference clock signal generator and configured to generate a plurality of thermometer-coded signals based on the reference clock signal and the reference voltage;
 a thermometer decoder coupled to the analog-to-digital converter and configured to generate a pulse train based on the plurality of thermometer-coded signals; and
 a phase-lock loop coupled to the thermometer decoder and configured to generate an output clock signal based on the pulse train and align a phase of the output clock signal with pulses of the pulse train.

2. The system of claim 1, wherein the analog-to-digital converted comprises:
 a voltage divider configured to generate a plurality of voltages by dividing the reference voltage based on a waveform of the reference clock signal; and
 a thermometer circuit coupled to the voltage divider and configured to generate the plurality of thermometer-coded signals based on the reference clock signal and the plurality of voltages.

3. The system of claim 2, wherein the reference clock signal generator is further configured to generate a quadrature clock signal based on the reference clock signal and the thermometer circuit comprises a plurality of comparators configured to generate the plurality of thermometer-coded signals based on the plurality of voltages, the reference clock signal, and the quadrature clock signal.

4. The system of claim 2, wherein the thermometer circuit comprises:
 a plurality of comparators configured to generate at least some of the thermometer-coded signals of the plurality of thermometer-coded signals based on the plurality of voltages and the reference clock signal; and
 a slew rate detector configured to generate a thermometer-coded signal of the plurality of thermometer-coded signals by determining a slew rate of the reference clock signal.

5. The system of claim 1, wherein the reference clock signal generator comprises:
 an automatic gain control circuit configured to generate the reference voltage and to generate a gain control signal based on the reference clock signal and the reference voltage;
 a crystal; and
 an oscillator coupled to the crystal and the automatic gain control circuit, the oscillator configured to generate the reference clock signal based on a resonant frequency of the crystal and maintain the peak amplitude of the reference clock signal based on the gain control signal.

6. The system of claim 1, further comprising a phase-lock loop configured to generate an output clock signal based on the pulse train and align a phase of the output clock signal with pulses of the pulse train.

7. The system of claim 1, wherein the reference clock signal has a sinusoidal waveform.

8. The system of claim 1, wherein the reference clock signal has a triangular waveform.

9. A system comprising:
 a reference clock signal generator configured to generate a reference voltage and a reference clock signal having a peak amplitude based on the reference voltage;
 an analog-to-digital converter coupled to the reference clock signal generator and comprising:
  a voltage divider configured to generate a plurality of voltages by dividing the reference voltage based on a waveform of the reference clock signal; and
  a thermometer circuit coupled to the voltage divider and configured to generate a plurality of thermometer-coded signals based on the reference clock signal and the plurality of voltages;
 a thermometer decoder coupled to the analog-to-digital converter and configured to generate a pulse train based on the plurality of thermometer-coded signals; and a phase-lock loop coupled to the thermometer decoder and configured to generate an output clock signal based on the pulse train and align a phase of the output clock signal with pulses of the pulse train.

10. The system of claim 9, wherein the reference clock signal generator is further configured to generate a quadrature clock signal based on the reference clock signal, and the thermometer circuit comprises a plurality of comparators configured to generate the plurality of thermometer-coded signals based on the plurality of voltages, the reference clock signal, and the quadrature clock signal.

11. The system of claim 9, wherein the thermometer circuit comprises:
   a plurality of comparators configured to generate at least some of the thermometer-coded signals of the plurality of thermometer-coded signals based on the plurality of voltages and the reference clock signal; and
   a slew rate detector configured to generate a thermometer-coded signal of the plurality of thermometer-coded signals by determining a slew rate of the reference clock signal.

12. The system of claim 9, wherein the reference clock signal generator comprises:
   an automatic gain control circuit configured to generate the reference voltage and to generate a gain control signal based on the reference clock signal and the reference voltage;
   a crystal; and
   an oscillator coupled to the crystal and the automatic gain control circuit, the oscillator configured to generate the reference clock signal based on a resonant frequency of the crystal and maintain the peak amplitude of the reference clock signal based on the gain control signal.

13. The system of claim 9, wherein the reference clock signal has a sinusoidal waveform.

14. The system of claim 9, wherein the reference clock signal has a triangular waveform.

15. A method comprising:
   generating a reference voltage;
   generating a reference clock signal having a peak amplitude based on the reference voltage;
   generating a plurality of thermometer-coded signals based on the reference clock signal and the reference voltage;
   generating a pulse train based on the thermometer-coded signals;
   generating an output clock signal based on the pulse train; and
   aligning a phase of the output clock signal with pulses of the pulse train.

16. The method of claim 15, wherein generating the plurality of thermometer-coded signals further comprises determining a slew rate of the reference clock signal.

17. The method of claim 15, further comprising generating a quadrature clock signal wherein generating the plurality of thermometer-coded signals further comprises generating the thermometer-coded signals based on the reference clock signal, the reference voltage, and the quadrature clock signal.

18. The method of claim 15, wherein the reference clock signal has a sinusoidal waveform.

19. The method of claim 15, wherein the reference clock signal has a triangular waveform.

20. The method of claim 15, wherein the pulse train has a square waveform.

* * * * *